United States Patent [19]

Chang et al.

[11] Patent Number: 5,576,236
[45] Date of Patent: Nov. 19, 1996

[54] PROCESS FOR CODING AND CODE MARKING READ-ONLY MEMORY

[75] Inventors: Tsun-Tsai Chang, Hsinchu; Vicent Liu, Keelung; Ming-Tsung Liu, Hsinchu, all of Taiwan

[73] Assignee: United Microelectronics Corporation, Hsinchu, Taiwan

[21] Appl. No.: 496,209

[22] Filed: Jun. 28, 1995

[51] Int. Cl.[6] .................................................. H01L 21/265
[52] U.S. Cl. .............................. 437/48; 437/52; 437/924
[58] Field of Search .................................. 437/48, 47, 52, 437/60, 45, 924; 148/DIG. 102

[56] References Cited

U.S. PATENT DOCUMENTS

| | | | |
|---|---|---|---|
| 4,230,504 | 10/1980 | Kuo | 437/52 |
| 5,051,374 | 9/1991 | Kagawa et al. | 437/8 |
| 5,393,233 | 2/1995 | Hong et al. | 437/48 |

*Primary Examiner*—H. Jey Tsai
*Attorney, Agent, or Firm*—Fish & Richardson, P.C.

[57] ABSTRACT

A process for coding and code marking a read-only memory device makes use of a buffer layer, such as silicon nitrides ($Si_3N_4$) or silicon oxynitrides ($SiN_xO_y$), to form a code mark therein. Owing to the etching selectivity between the buffer layer and an underlying layer, for example, silicon oxides, the programmed region not covered by the word lines will not suffer from etching damage while forming the code mark. Therefore, the coding and code marking process can employ the same mask layer, but without the need for two different photomasking procedures to implement code programming and identification code marking.

13 Claims, 4 Drawing Sheets

5,576,236

1

PROCESS FOR CODING AND CODE MARKING READ-ONLY MEMORY

BACKGROUND OF THE INVENTION

1. Field of the Invention

The present invention relates in general to a process for fabricating semiconductor read-only memory devices, and particularly relates to a process of simultaneous memory-content coding and identification code marking in the fabrication of read-only memory devices.

2. Technical Background

Read-only memory devices, herein referred to as ROM devices, are widely utilized in various kinds of digital electronic equipment that require the use of stored data and program codes. ROM semiconductor devices, specifically ROM IC's, are fabricated in processes that can be generally divided into two stages. Due to the different application purposes that are involved in the use of these ROM IC's, they can be fabricated with basically the same process steps up to the stage prior to memory cell content programming. The remaining fabrication process steps, after a particular memory content is designated for a ROM product, however, will be different, if the code mask that is utilized for the programing of the specific code content is considered. Basically, the code masks possess the particular mask patterns that correspond to the code contents of the manufactured ROMIC device. Any two code masks for the same type of ROM device with different code contents will have different mask patterns.

However, even after the code mask is utilized in the impurity implantation procedure that implants impurities into the memory cells of the programmed ROM device for the selective programing of the memory bits, and before the semiconductor wafer is processed as separate dies for the IC and packaged, ID code marking applied to the periphery of the wafer thereof must be utilized for the human identification of the ROM device. This is because all ROM IC devices contained on a wafer at this stage will appear the same to human eyes. The identification code marking made on the periphery area of the wafers that contain tens or hundreds of independent ROM dies may then be conveniently used for the identification of the different wafer products at this stage.

FIGS. 1a–1c respectively show the cross-sectional views of the memory cell unit of a conventional ROM device as depicted in selected steps of its process of fabrication. This depicted conventional ROM device is utilized herein for a brief description of the prior art. On the other hand, FIG. 2a schematically shows the top view of the memory cell unit of the conventional ROM device, and FIGS. 2b and 2c respectively show the cross-sectional views of the conventional ROM device as depicted by cutting along the two selected cross-sectioning lines II—II and II'—II' lines in FIG. 2a. The exemplified process as depicted in FIGS. 1a–1c and FIGS. 2a–2c include the programming of the code content, as well the implementation of the ID code marking. In the depicted drawings, the ROM device is fabricated on a P-type silicon substrate 1.

As is seen in the cross-sectional view of FIG. 1a, N-type impurities are implanted into the P-type substrate 1, forming a number of N-type bit lines 10 isolated from each other, as observed from the cross-sectional view. An ID code marking layer 100 is also formed along the periphery of the P-type silicon substrate 1. The formation of the code mark layer 100 may be, for example, the field oxide layer formed by the implementation of a local oxidation of silicon (LOCOS) procedure.

Then, regions other than the code mark layer 100 are further oxidized, forming the dielectric layer 12 with, for example, silicon oxides, that covers the surface of the P-type substrate 1 as well as the surface of the N-type bit lines 10. Since the bit lines 10 have N-type impurities implanted therein, therefore they sustain a faster rate of thermal oxidation, with the result that the dielectric layer 12 is formed more thickly over the surface of the bit lines 10 than at other areas of the surface of the substrate 1. This situation is schematically shown in the cross-sectional view of FIG. 1a.

Next, a number of word lines 14 are then formed, with the longitudinal direction thereof orthogonal to the longitudinal direction of the bit lines 10. As is well known in the art, the word lines 14 are parallel strips spaced-apart from each other. The word lines 14 may be formed by, for example, depositing a layer of polysilicon material with a thickness of about 3000Å, or, by subsequently depositing polysilicon and $WSi_x$ layers of about 1500Å, respectively.

Then, an oxide spacer 102 is formed at the end of the word lines 14. This may be formed by, for example, first depositing a layer of silicon oxide of about 2500Å, and then subjecting it to an etching-back process.

Referring next to FIG. 1b of the drawing. When the process proceeds to the programming of the memory cell content of the ROM device, a code mask 104 is formed by a lithography process with the required mask pattern. Then, with the shielding over the designated regions on the surface of the semiconductor substrate 1 as provided by the code mask 104, which shields the code mark layer 100, as well as those regions of the memory cell that not require memory bit programing, the desired regions over the surface of the substrate 1 are shielded for the implementation of an implantation procedure that implants P-type impurities, such as $BF_2$ or B ions, into the memory cell regions to be programmed.

For example, when P-type impurities are implanted into the second type data regions 18 of the selected memory cells, while all other selected memory cells designated for the first type data regions 16 are shielded from implantation, as is shown schematically in FIG. 1b, the program/data code content of the ROM device will be suitably programmed. As is well known to persons skilled in the art, the implantation of P-type impurities into the second type data regions 18 allows the regions to have an increased threshold voltage. This means the memory cells with second type data regions 18 will be in an OFF state when accessed. All other memory cells with the first type data regions 16 will, in contrast, be in an ON state when accessed. Normally, the implanted P-type impurity may be, for example, boron or $BF_2$, and the typical implantation energy level is about 130 keV, at an implantation dosage of about $2\times10^{14}$ cm$_{-2}$.

Then, as shown in FIG. 1c, the programming code mask layer 104 can be removed, and another lithography procedure may then be implemented, with the ID code mark masking layer 106 deployed over the surface of the substrate 1, so that the ID code mark 108 may be made in the ID code mark layer 100 in the designated peripheral area on the semiconductor wafer, that is, the silicon substrate 1.

With reference to FIG. 2a of the drawing, an ID code mark 108, which in this example made into the shape of a number "1", is formed for the purpose of human identification when the wafer is handled in the subsequent process stages. FIG. 2b, which schematically shows the cross section of the ROM device taken along the II—II line of FIG. 2a, clearly shows that the width of the second type data region 18 is wider than that of the bit lines 14. The reason for this is to allow for the alignment tolerance for the bit lines 14 in the fabrication procedure. This, however, signifies the need that the program/code and ID code mark be fabricated in two separate photomasking processes.

If, however, the intention is to make both the memory cell code programming and the ID code marking simultaneously in one lithography procedure for this conventional technique of ROM device fabrication, there is a risk of inadequately etching the exposed areas of the second type data regions 18 that are not covered by the bit lines 14. Refer to FIG. 2c, which shows the cross-sectional view of the cross section cut along the II'—II' line in FIG. 2a. In this cross section, the dielectric layer 12, which is exposed out of the coverage of the bit line 14, will also be subjected to the etching process that was intended primarily for the formation of the ID code mark 108 on the ID code marking layer 100. If the etching to the exposed dielectric layer 12 is excessive, inadequate conduction may result in these overly-etched regions of the memory cell, resulting in the erroneous data reading of the ROM device. The only method for avoiding this consequence in the prior art procedure of ROM device fabrication is to come out the coding of the memory cells and the making of the ID code mark in two separate photolithography procedures.

SUMMARY OF THE INVENTION

It is therefore a primary object of the present invention to provide a process for fabricating a semiconductor mask ROM device with simultaneous fabrication of both the memory content and the ID code mark.

It is another object of the present invention to provide a process for fabricating a semiconductor mask ROM device with the fabrication of both the memory content and the ID code mark in one single lithography procedure without damaging to the memory cell regions.

The present invention achieves the above-identified objects by providing a process for fabricating memory cell code content and the identification code marking for ROM IC devices. The ROM device is fabricated on a P-type semiconductor substrate, with the identification code marking fabricated on a code-marking layer in the designated peripheral area of the substrate. The process comprises the steps of: (a) forming a number of isolated and parallel N-type bit lines for the ROM device on the surface of the substrate, with the longitudinal direction of the bit lines being oriented along a first direction on the substrate; (b) forming a dielectric layer covering the surface of the substrate excluding the code-marking layer but including the bit lines; (c) forming a number of isolated and parallel word lines for the ROM device on the surface of the substrate covering portions of the bit lines, the word lines having a longitudinal direction oriented along a second direction on the substrate, and then forming a buffer layer covering the entire surface of the substrate; and (d) forming a masking layer with a designated pattern for programming said memory cells by implanting impurities of the first type into the selected memory cells defined by said masking layer, forming data regions of the second type, with memory cells not designated for the impurity implantation remaining data regions of a first type, and then implementing an etching process for forming the identification code marking in the buffer layer over the code marking layer. The process of fabrication is characterized by being capable of facilitating both the code programming and the identification code marking with a single photomasking procedure.

BRIEF DESCRIPTION OF THE DRAWING

Other objects, features and advantages of the present invention will become apparent by way of the following detailed description of the preferred but non-limiting embodiment. The description is made with reference to the accompanied drawings, wherein:

FIG. 2a schematically shows the top view of the memory cell unit of a conventional ROM device, and FIGS. 2b and 2c respectively show the cross-sectional views of the conventional ROM device as depicted by cutting along the two selected cross-sectioning lines II—II and II'—II' lines in FIG. 2a;

FIG. 4a schematically shows the top view of the memory cell unit of the ROM device of the present invention, and FIGS. 4b and 4c respectively show the cross-sectional views of the ROM device of the present invention as depicted by cutting along the two selected cross-sectioning lines IV—IV and IV'—IV' lines in FIG. 4a.

DETAILED DESCRIPTION OF THE PREFERRED EMBODIMENTS

Figure 3A:
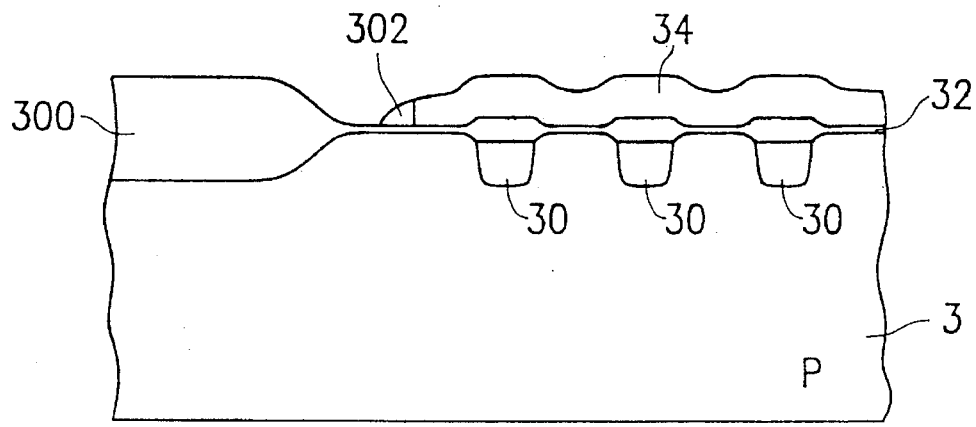
FIGS. 3a–3c respectively show the cross-sectional views of the memory cell unit of a ROM device as depicted in the selected steps of its process of fabrication in accordance with a preferred embodiment of the present invention.
Figure 3B:
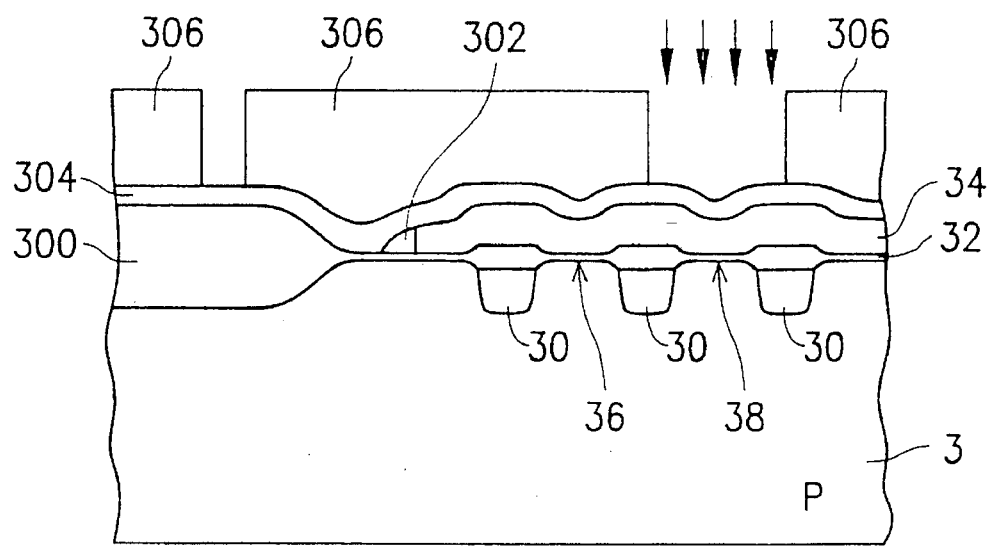
Figure 3C:
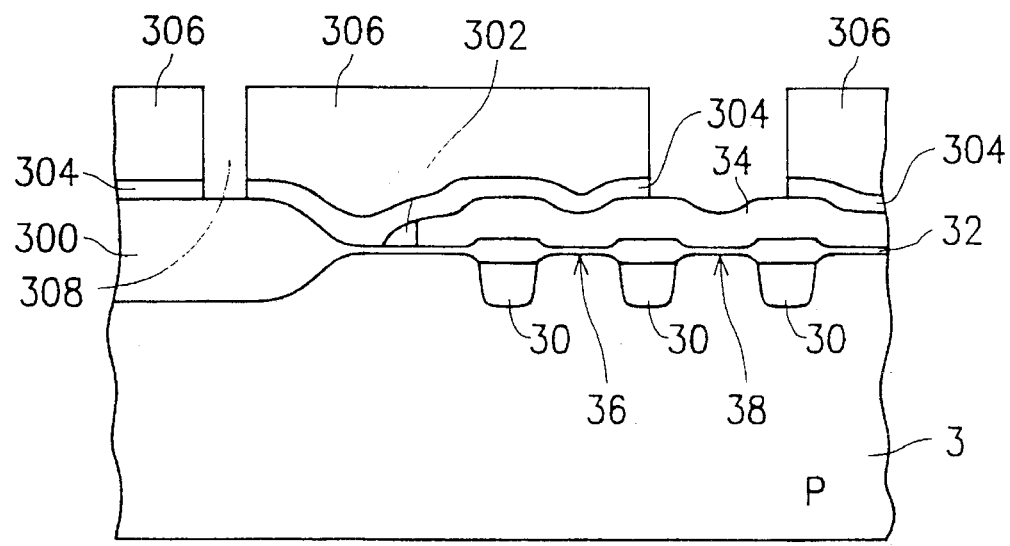
Figure 4A:
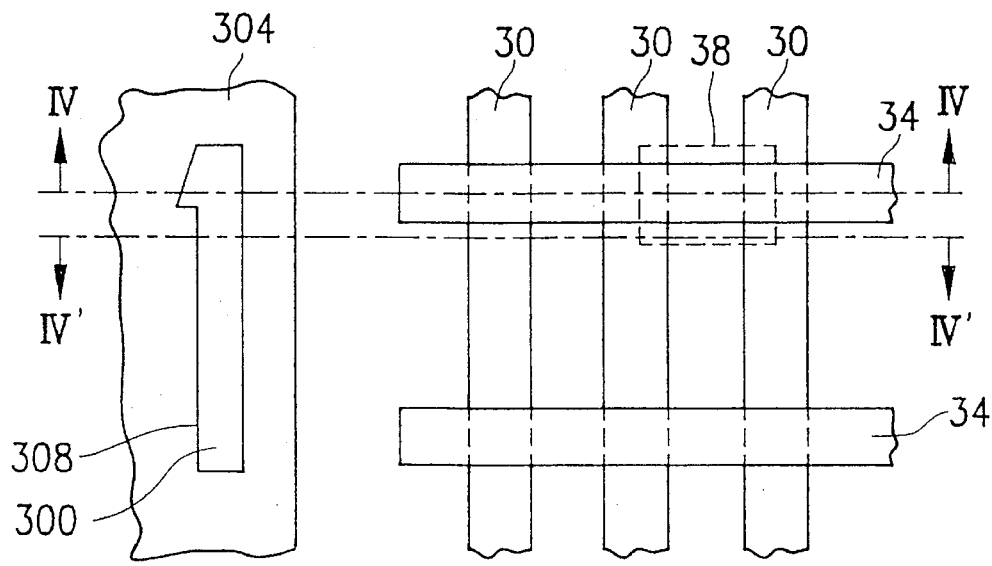
Figure 4B:
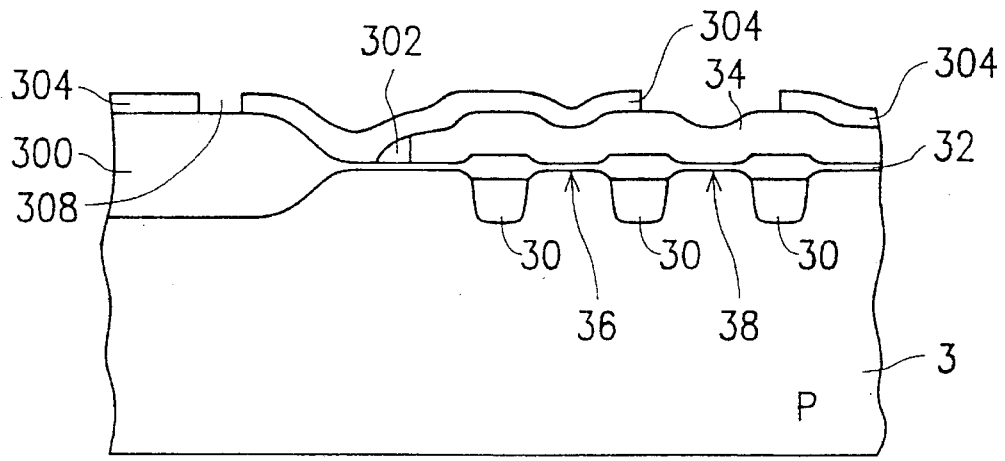
Figure 4C:
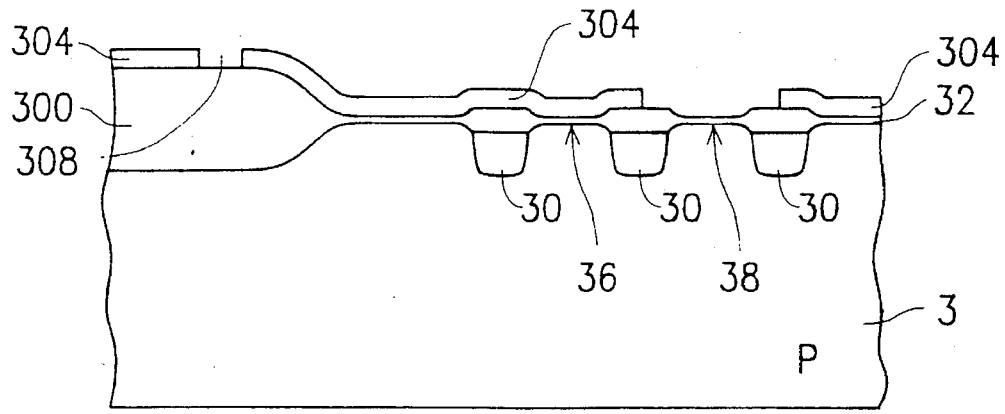

Reference is made to FIGS. 3a–3c, simultaneously with FIGS. 4a–4c of the accompanying drawing for a description of the preferred embodiment of the present invention. FIGS. 3a–3c respectively show the cross-sectional views of the memory cell unit of a ROM device as depicted in the selected steps of its process of fabrication in accordance with a preferred embodiment of the present invention. On the other hand, FIG. 4a schematically shows the top view of the memory cell unit of the ROM device of the present invention. FIGS. 4b and 4c show the cross-sectional views of the ROM device of the present invention respectively as depicted by cutting along the two selected cross-sectioning lines IV—IV and IV'—IV' lines in FIG. 4a In the description of the preferred embodiment of the present invention as outlined in the accompanying drawing, a semiconductor substrate, for example a silicon substrate, of P-type is employed as the basis for the construction of the subject mask ROM device. The process steps of the fabrication procedure are described below.

First, referring to FIG. 3a, a cross-sectional view, N-type impurities are implanted into the P-type substrate 3, forming a number of N-type bit lines 30 spaced apart from each other. An ID code marking layer 300 is also formed along the periphery of the P-type substrate 3 to define an active region. The formation of the ID code marking layer 300 may be, for example, the field oxide layer formed by the implementation of a local oxidation of silicon (LOCOS) procedure.

Then, regions other than the ID code marking layer 300 are further oxidized, forming the dielectric layer 32 made of, for example, silicon oxides, that covers the surface of the P-type substrate 3 as well as the surface of the N-type bit lines 30. Since the bit lines 30 have N-type impurities implanted therein, therefore, they sustain a faster rate of thermal oxidation, with the result that the formation of the dielectric layer 32 is thicker over the surface of the bit lines 30 than at other area of the surface of the substrate 3. This situation is schematically shown in the cross-sectional view of FIG. 3a.

Next, a number of word lines 34 are then formed, with the longitudinal direction thereof orthogonal to the longitudinal direction of the bit lines 30. The word lines 34 are parallel strips spaced-apart from each other which may be formed by, for example, depositing a layer of polysilicon material with a thickness of about 3000Å, or, by subsequently depositing polysilicon and $WSi_x$ layers of about 1500Å, subsequently.

Then, an oxide spacer 302 is formed at the edge of the word lines 34. This may be formed by, for example, first depositing a layer of oxide of about 2500Å, and then subject it to an etching-back process.

Figure 1A:
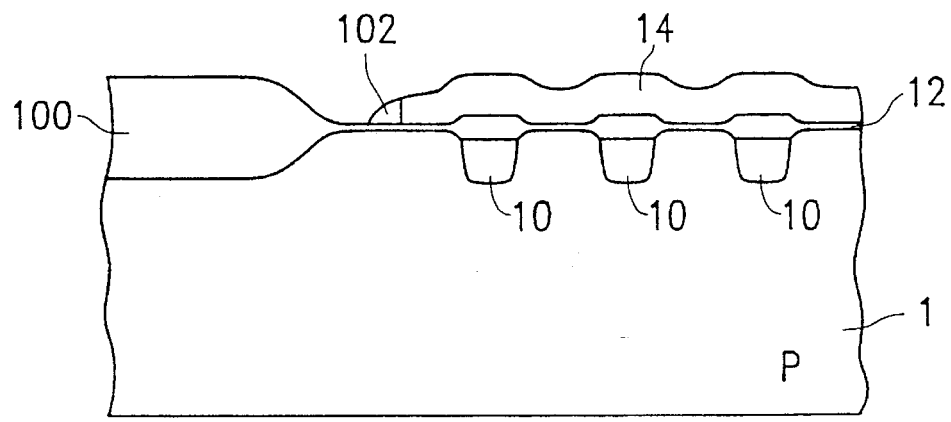
FIGS. 1a–1c respectively show the cross-sectional views of the memory cell unit of a conventional ROM device as depicted in selected steps of its process of fabrication.
Figure 1B:
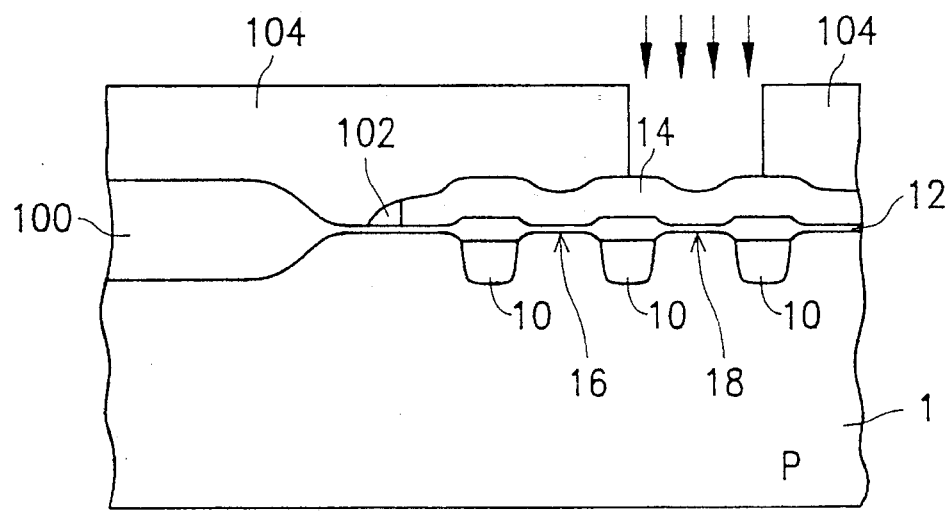
Figure 1C:
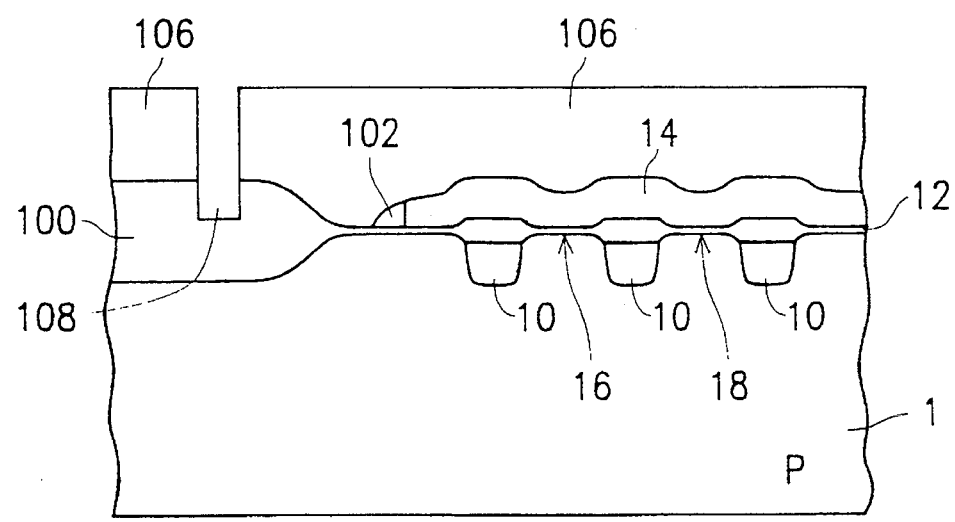
Figure 2A:
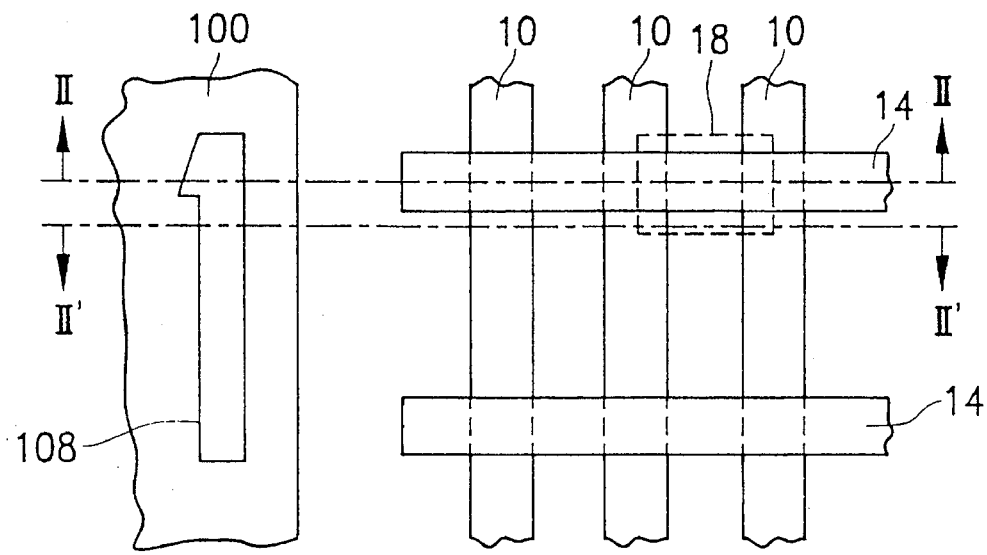
Figure 2B:
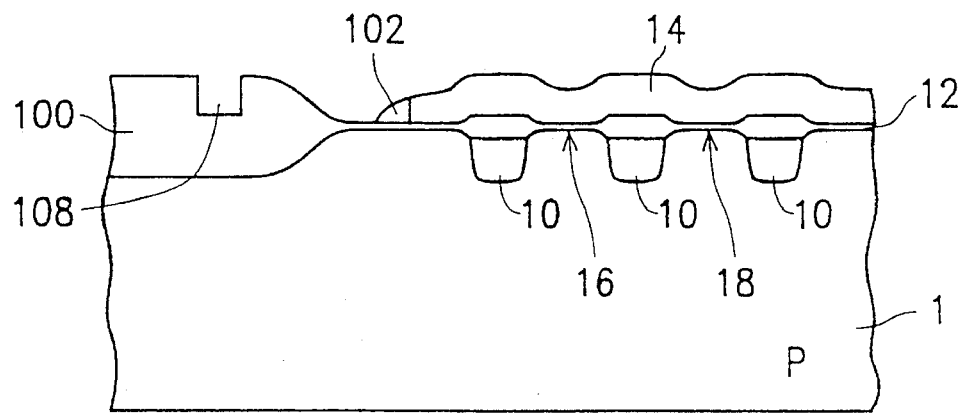
Figure 2C:
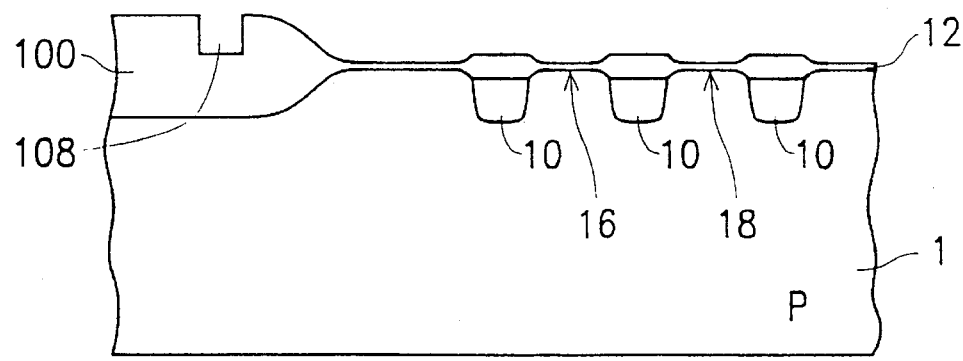

Next, as the second stage of the fabrication, reference is made to FIG. 1b of the drawing. A buffer layer 304 is then formed over the surface of the semiconductor substrate 3 at this stage. This buffer layer 304 may be formed of materials, such as silicon nitrides $Si_3N_4$ or silicon oxynitrides $SiN_xO_y$, etc having a thickness between 500 to 1500 Angstroms. After the formation of the buffer layer 304, another mask layer 306, such as a photoresist layer, for coding and code marking is then formed through lithography procedure over the buffer layer 304. The mask layer 306 is utilized to simultaneously facilitate the memory cell content programming and the ID code mark in the subsequent etching procedure. This can be achieved by defining both the memory cell programming pattern for the selected memory cells and the ID code marking at the periphery of the substrate 3.

That is, when programming the selected memory cells of the ROM device, the mask layer 306 formed by deploying a photomask with the required mask pattern for both the memory content and the ID code marking can be utilized to shield the areas of the substrate 3 that are not to be subjected to the ion implantation procedure for the memory cell programming. With the shielding effective for the designated regions on the surface of the semiconductor substrate 3 which are those regions of the memory cell that do not require the memory bits programmed, the implementation of an implantation procedure that implants P-type impurities into the memory cell regions to be programmed can be facilitated.

For example, when P-type impurities are implanted into the second type data regions 38 of the selected memory cells, while all other selected memory cells designated for the first type data regions 36 are shielded from ion implantation, as is shown schematically in FIG. 3b, the program/data code content of the ROM device will be suitably programmed. The implantation of P-type impurities into the second type data regions 38 allows the regions to have an increased threshold voltage. Memory cells with second type data regions 38 will be in an OFF state when accessed. All other memory cells with the first type data regions 36 will be in an ON state when accessed. The implanted P-type impurities may be, for example, boron, and the typical implantation energy level is about 160 keV, at an implanted impurity dosage of about $2 \times 10^{14}$ $cm^{-2}$.

Then, as shown in FIG. 3c, with the presence of the mask layer 306, a controlled etching process can be implemented to remove the regions of the buffer layer 304 exposed out of the coverage of the layer 306. Afterwards, the mask 306 can then be removed, and this allows the formation of the ID code mark 308 in the buffer layer 304 on the ID code marking layer 300, without even touching the dielectric layer 32 by the etching, due to the presence of the buffer layer 304.

Attention is directed to FIGS. 4a–4c of the drawing now. With FIGS. 4b and 4c showing the cross-sectional views of the ROM device fabricated in accordance with the preferred embodiment of the present invention, as cut along the IV—IV and IV'–IV' lines in FIG. 4a respectively, it can be observed that the buffer layer 304 provides for the protection of the first type data regions 36 when the mask layer 306 is removed. Thus the dielectric layer 32 may be kept intact, with substantially no damage of the dielectric layer 32 at all.

Thus, the above-described preferred embodiment of the present invention is utilized only for the purpose of the description of the present invention. Persons skilled in this art can appreciate the fact that other similar arrangements can be devised from the embodiment disclosed above without departing from the spirit of the present invention, which is recited in the following claims.

What is claimed is:

1. A process for coding and code marking a read-only memory device on a semiconductor substrate of a first conductivity type, comprising:

(a) forming a code-marking layer on said semiconductor substrate to define an active region;

(b) forming a plurality of spaced-apart and parallel bit lines of a second conductivity type in said substrate within said active region, a longitudinal direction of said bit lines being oriented along a first direction;

(c) forming a dielectric layer covering said active region;

(d) forming a plurality of spaced-apart and parallel word lines on said dielectric layer, said word lines having a longitudinal direction oriented along a second direction;

(e) forming a buffer layer overlying an entire surface of said substrate; and (f) forming a mask layer with a designated pattern of said coding and said code marking of said read-only memory device on said buffer layer;

(g) coding said memory device by implanting impurities of said first conductivity type into said substrate through the pattern of said mask layer; and (h) forming a code mark over said code-marking layer by etching said buffer layer using said mask layer as an etch mask.

2. The process for coding and code marking said read-only memory device of claim 1, wherein said first direction and said second direction are orthogonal directions.

3. The process for coding and code marking said read-only memory device of claim 1, wherein said buffer layer has a thickness of about 500–1,500ÅA.

4. The process for coding and code marking said read-only memory device of claim 3, wherein said buffer layer is formed of silicon nitrides.

5. The process for coding and code marking said read-only memory device of claim 3, wherein said buffer layer is formed of silicon oxynitrides.

6. The process for coding and code marking said read-only memory device of claim 1, wherein said bit lines are formed by an implantation procedure.

7. The process for coding and code marking said read-only memory device of claim 1, wherein said word lines are formed of polysilicon.

8. The process for coding and code marking said read-only memory device of claim 1, wherein said word lines are formed by depositing subsequent layers of polysilicon and WSi$_x$.

9. The process for coding and code marking said read-only memory device of claim 8, wherein said word lines further have spacers formed at side walls thereof.

10. The process for coding and code marking said read-only memory device of claim 1, wherein said code marking layer consists of silicon oxides formed by a local oxidation of silicon (LOCOS) procedure.

11. The process for coding and code marking said read-only memory device of claim 1, wherein said first conductivity type is P-type, and said second conductivity type is N-type.

12. The process for coding and code marking said read-only memory device of claim 1, wherein said dielectric layer consists of silicon oxides obtained through a thermal oxidation procedure.

13. The process for coding and code marking said read-only memory device of claim 1, wherein said impurities of said first conductivity type implanted in step (g) are boron, with an implantation energy of about 160 keV and an implantation dosage of about $2\times10^{14}$ cm$^{-2}$.

* * * * *